United States Patent
Zeng et al.

(10) Patent No.: US 8,312,358 B2
(45) Date of Patent: Nov. 13, 2012

(54) TAIL-BITING DECODING METHOD AND DEVICE

(75) Inventors: Yunbao Zeng, Shenzhen (CN); Jingxin Wei, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 260 days.

(21) Appl. No.: 12/869,887

(22) Filed: Aug. 27, 2010

(65) Prior Publication Data

US 2011/0060971 A1    Mar. 10, 2011

(30) Foreign Application Priority Data

Sep. 8, 2009    (CN) .......................... 2009 1 0190042

(51) Int. Cl.
*H03M 13/03*    (2006.01)
(52) U.S. Cl. ........................................ 714/795; 714/796
(58) Field of Classification Search .................. 714/795, 714/796
See application file for complete search history.

(56) References Cited

U.S. PATENT DOCUMENTS

| | | | |
|---|---|---|---|
| 6,256,764 B1 | 7/2001 | Atallah | |
| 6,877,132 B1 * | 4/2005 | De et al. ........................ | 714/795 |
| 2005/0091566 A1 * | 4/2005 | Berens et al. .................. | 714/755 |
| 2008/0317112 A1 * | 12/2008 | Oh et al. ........................ | 375/232 |
| 2009/0135938 A1 * | 5/2009 | Hedayat et al. ............... | 375/265 |

FOREIGN PATENT DOCUMENTS

| | | |
|---|---|---|
| CN | 1124692 | 10/2003 |
| EP | 0920138 | 10/2006 |

OTHER PUBLICATIONS

Wilkie, B. et al., *Viterbi Decoder Block Decoding—Trellis Termination and Tail Biting*, XILINX, XAPP551 (1.0), Feb. 14, 2005, pp. 1-12.

* cited by examiner

*Primary Examiner* — M. Mujtaba K Chaudry
(74) *Attorney, Agent, or Firm* — Staas & Halsey LLP

(57) ABSTRACT

A tail-biting decoding method and device are provided, so as to improve accuracy of backtracking state determination and decrease decoding delay. The method includes the following steps. Survivor paths of a training system are acquired. The training system is formed of a first transport block and a second transport block connected in series. The number of the survivor paths passing through each first state of the second transport block is counted. A first state having a maximum number of the survivor paths may be selected as a backtracking state of the second transport block. Backtracking decoding is performed on the second transport block by using the survivor paths on the backtracking state, so as to obtain a decoding result.

14 Claims, 3 Drawing Sheets

TAIL-BITING DECODING METHOD AND DEVICE

CROSS-REFERENCE TO RELATED APPLICATION

This application claims priority to Chinese Patent Application No. 200910190042.5, filed on Sep. 8, 2009, which is hereby incorporated by reference in its entirety.

FIELD OF THE TECHNOLOGY

The present invention relates to the field of codec technology, and more particularly to a tail-biting decoding method and device.

BACKGROUND OF THE INVENTION

In the prior art, a coded modulation method of tail-biting convolutional code, which is illustrated by taking a tail-biting convolutional code used in a long term evolution (LTE) system as an example, is introduced. A (3, 1, 6) coder is as shown in FIG. 1. A constraint length of the coder is 7 and a code rate is ⅓. In FIG. 1, a binary sequence for generating a polynomial $G_i$ (i=0, 1, 2) represents the input data and a connection status of 6 shift registers D and the output of the ith path of a coder. The binary 0 represents disconnected status and the binary 1 represents connected status. In FIG. 1, an adder is used in a GF(2) domain. An initial state of a shift register is the last 6 bits of the input bit sequence. $\eta_0, \eta_1, \eta_2, \ldots, \eta_5$ represent the 6 shift registers in sequence. The input bit sequence of the channel coding is marked as $c_0, c_1, c_2, c_3, \ldots, c_{K-1}$ and the bit sequence length is K. The bit sequence output by the ith path after coding is marked as $d_0^{(i)}, d_1^{(i)}, d_2^{(i)}, \ldots, d_{D-1}^{(i)}$, in which the D is the sequence length, and D=K for the tail-biting convolutional code. At the initial state, $\eta_i = c_{(K-1-i)}$ (i=0, 1, ... 5), so that when the input bit sequence is ended, the state of the shift register is the same with the initial state when the coding starts.

A Viterbi decoding algorithm of a convolutional code is introduced in the following. It is assumed that a convolutional code coder inputs a bit data at a time. A state collection of the coder is set to be $S=\{s_1, s_2, \ldots, s_N\}$, in which the N is the total number of states, and $N=2^M$. The M is the number of the shift registers in the coder, and the shift registers are marked as $\eta_0, \eta_1, \eta_2, \ldots, \eta_{M-1}$. The $C=\{c_0, c_1, c_2, c_3, \ldots, c_{K-1}\}$ is set to be the coding input sequence, in which K is the sequence length. The Bit $c_k$ (having a value of 0 or 1) is sent into the coder at a moment t=k (k=0, 1, ..., K−1) and it is assumed that the delay of the coder is 1, so that at a moment t=k+1, the coding of the bit $c_k$ is completed and the bit $c_{k+1}$ enters the coder. The coding output of $c_k$ is $d_k^{(i)}$ (i=1, 2, ..., R), in which the R is a reciprocal of the convolutional code rate. The output sequence of the coder is marked as:

$$D=\{d_0^{(1)}, d_0^{(2)}, \ldots, d_0^{(R)}, d_1^{(1)}, \ldots, d_{K-1}^{(1)}, d_{K-1}^{(2)}, \ldots, d_{K-1}^{(R)}\}.$$

The transmission sequence after mapping 0→−1, 1→1 is (transmission energy is 1):

$$E=\{e_0^{(1)}, e_0^{(2)}, \ldots, e_0^{(R)}, e_1^{(1)}, \ldots, e_{K-1}^{(1)}, e_{K-1}^{(2)}, \ldots, e_{K-1}^{(R)}\}.$$

The received data sequence through an additive white Gaussian noise (AWGN) channel is:

$$Y=\{y_0^{(1)}, y_0^{(2)}, \ldots, y_0^{(R)}, y_1^{(1)}, \ldots, y_{K-1}^{(1)}, y_{K-1}^{(2)}, \ldots, y_{K-1}^{(R)}\}.$$

The equation $y_k^{(i)} = e_k^{(i)} + n_k^{(i)}$ is introduced, in which the $n_k^{(i)}$ is independent noise, and real Gaussian distribution of 0 expect and $\sigma^2$ variance are adapted for the noise.

The output end performs decoding according to the maximum likelihood (ML) criterion, that is, the maximum likelihood sequence $$\hat{C} = \underset{C \in \Omega}{\operatorname{argmax}} \ln Pr(Y \mid C)$$

is output as decode result. $\Omega$ is a collection of all the codes. It is assumed that the channel has no memory, $$\ln Pr(Y \mid C) = \sum_{i,k} \ln Pr(y_k^{(i)} \mid e_k^{(i)}). \quad (1.)$$

The $\ln Pr(Y|C)$ is defined as the path metric of an input sequence of the C. The $$\mu_k(C) = \sum_{i=1}^{R} \ln Pr(y_k^{(i)} \mid e_k^{(i)})$$

is defined as a branch metric. The probability density function of the noise is:

$$p(y_k^{(i)} \mid e_k^{(i)}) = \frac{1}{\sqrt{2\pi}\,\sigma} \exp\left[-\frac{1}{2\sigma^2}|y_k^{(i)} - e_k^{(i)}|^2\right].$$

The public items of the path are omitted and the branch metric can be simplified as follows.

$$\mu_k(C) = \sum_{i=1}^{R} y_k^{(i)} e_k^{(i)}. \quad (2.)$$

The output of the ML decode is $$\hat{C} = \underset{C \in \Omega}{\operatorname{argmax}} \sum_{k=0}^{K-1} \mu_k(C).$$

In the prior art, the Viterbi algorithm is generally used to achieve the maximum likelihood decoding of a convolutional code. At a moment t=0, an initial cumulative path metric value is set for each state. If the initial state is undetermined, the cumulative path metric value of each state at the initial moment is the same. At a moment t=k, merely two branches point to the same state $s_n$ at the moment t=k+1, and the cumulative metric value of the two paths are equal to the cumulative metric value of a state at a previous moment plus the current branch metric value. At a moment t=k+1, the two paths pointing to the $s_n$ are compared, and the path having a larger path metric value is selected as a survivor path, and the metric value thereof is considered as a cumulative path metric value of a state $s_n$ at a new moment. An add-compare-select process of the Viterbi decoding algorithm is shown in FIG. 2. After the add-compare-select process is completed, one of the survivor paths of all states, which has the maximum cumulative path metric value, is selected as a backtracking path, so as to obtain the decoding output.

As for tail-biting convolutional code, the states of the coder at the first moment and the end moment are the same, and this characteristic may be used during decoding to improve the performance. A transport block (TB Block) is corresponding to a data receiving block. Because the first state and the end state of the coder are the same, a transport block may be repeated L times, that is, L transport blocks are connected in series to decode a long sequence. Among the decoding methods in the prior art, taking L=3 as an example, when decoding, three transport blocks are used to calculate the survivor path. However, when backtracking is finished, only the decoding data of the second transport block serves as decoding output. The first transport block may be considered to provide a correct initial state for the second transport block, and the third transport block may be considered to provide a correct backtracking state for the second transport block.

The prior art has at least the following problems. Decoding is performed through 3 transport blocks connected in series, and the backtracking state is determined according to the cumulative path metric value, so that accuracy of determining the backtracking state is not high, and the decoding delay is big.

SUMMARY OF THE INVENTION

The embodiments of the present invention relate to a tail-biting decoding method and device.

The embodiments of the present invention employ the following technical solutions.

The embodiments of the present invention provide a tail-biting decoding method, which includes the following process: acquiring survivor paths of a training system, wherein the training system is formed of a first transport block and a second transport block, which are connected in series; counting the number of survivor paths passing through each first state of the second transport block; selecting a first state having a maximum number of survivor paths as a backtracking state of the second transport block, or selecting at least two first states whose numbers of survivor paths rank at the top as backtracking states of the second transport block; and performing backtracking decoding on the second transport block by using survivor paths of a selected backtracking state, to obtain a decoding result.

The embodiments of the present invention provide a tail-biting decoding device, which includes a path acquisition unit, a counting unit, a selection unit, and a backtracking unit.

The path acquisition unit is configured to acquire survivor paths of a training system, wherein the training system is formed of a first transport block and a second transport block, which are connected in series.

The counting unit is configured to count the number of survivor paths passing through each first state of the second transport block.

The selection unit is configured to select a first state having a maximum number of survivor paths as a backtracking state of the second transport block, or select at least two first states whose numbers of survivor paths rank at the top as backtracking states of the second transport block.

The backtracking unit is configured to perform backtracking decoding on the second transport block by using survivor paths of a selected the backtracking state, to obtain a decoding result.

BRIEF DESCRIPTION OF THE DRAWINGS

To illustrate the technical solutions according to the embodiments of the present invention or in the prior art more clearly, the accompanying drawings for describing the embodiments or the prior art are introduced briefly in the following. Apparently, the accompanying drawings in the following description are only some embodiments of the present invention, and persons of ordinary skill in the art can derive other drawings from the accompanying drawings without creative efforts.

DETAILED DESCRIPTION OF THE EMBODIMENTS

The technical solution of the present invention will be clearly and completely described in the following with reference to the accompanying drawings. It is obvious that the embodiments to be described are only a part rather than all of the embodiments of the present invention. All other embodiments obtained by persons skilled in the art based on the embodiments of the present invention without creative efforts shall fall within the protection scope of the present invention.

Figure 3:
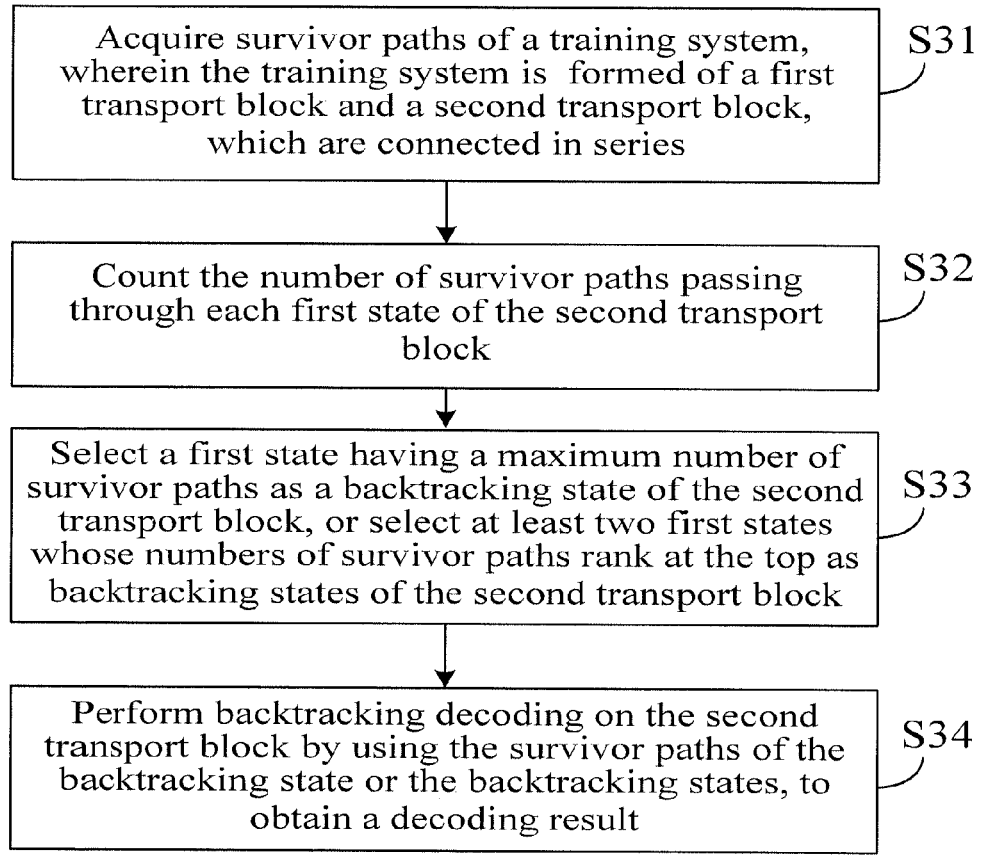
FIG. 3 is a schematic view of a tail-biting decoding method according to an embodiment of the present invention.

FIG. 3 is a schematic view of a tail-biting decoding method according to an embodiment of the present invention, which includes the following process.

S31: Acquire survivor paths of a training system, wherein the training system is formed of a first transport block and a second transport block, which are connected in series.

S32: Count the number of survivor paths passing through each first state of the second transport block.

S33: Select a first state having a maximum number of survivor paths as a backtracking state of the second transport block, or select at least two first states whose numbers of survivor paths rank at the top as backtracking states of the second transport block.

S34: Perform backtracking decoding on the second transport block by using the survivor paths of the backtracking state or the backtracking states, to obtain a decoding result.

In this embodiment, a first state having the maximum number of the survivor paths is selected as a backtracking state of the second transport block, or at least two first states whose numbers of survivor paths rank at the top are selected as backtracking states of the second transport block, so that the accuracy of backtracking state determination is improved. A training system merely formed of two transport blocks is required for decoding, so that the decoding delay is decreased. The first transport block and the second transport block are adapted to form a training system, and survivor paths can be obtained from the training system. Only the second transport block is decoded during backtracking decoding. Because the first state and the end state of the tail biting decoding are the same, the first state selected as the backtracking state is one of the end states of the corresponding transport block. Therefore, a selected backtracking state may be chosen from the end states of the second transport block, and backtracking decoding may be performed on the second transport block from the backtracking state. In this embodiment, the number of the survivor paths on a state is also called as reliability of the state. If the number of the survivor paths on a state is larger, the reliability of the state is higher, and the state is more suitable for serving as a backtracking state. Therefore, the strategy of selecting the backtracking state according to the embodiments of the present invention may be called the highest reliability criterion.

In an example of the embodiment, the S34 may include the following process. A survivor path having the maximum branch cumulative metric value on the backtracking state is selected as an initial backtracking path. A survivor path having a branch cumulative metric value next to the branch cumulative metric value of the initial backtracking path on the backtracking state is selected as a competition path. Backtracking decoding is performed on the second transport block by using the initial backtracking path. When the backtracking decoding performed on the second transport block by using the initial backtracking path has an incorrect result, backtracking decoding is performed on the second transport block by using the competition path. It should be understood that according to common backtracking decoding methods, backtracking decoding is performed from a survivor path having the maximum branch cumulative metric value on a state. In this embodiment, the survivor path having the maximum branch cumulative metric value on the backtracking state is selected as the initial backtracking path, and the survivor path having a branch cumulative metric value next to the branch cumulative metric value of the initial backtracking path on the backtracking state is selected as the competition path. The competition path may be considered as an alternative path. Backtracking calculation may be performed by using the initial backtracking path and the competition path, so that probability of success and the accuracy of backtracking decoding from the backtracking state are improved. Here, the method of selecting a competition path as an alternative path may be called as a multi-path criterion.

Furthermore, during the process described above, if at least two competition paths exist, a competition path closest to an end state is selected from the at least two competition paths, and backtracking decoding is performed on the second transport block by using the selected competition path. For example, if 5 competition paths exist, a survivor path closest to an end state may be selected from the 5 competition paths as a competition path.

In this embodiment, one backtracking state or a plurality of backtracking states may exist. When at least two backtracking states exist, the at least two backtracking states may be arranged in sequence according to the number of the survivor paths on each backtracking state. Backtracking decoding is performed on the second transport block according to the sequence by using the survivor paths on each backtracking state in turn, and the decoding process is finished when a decoding result is obtained. In this process, the backtracking states are arranged in sequence according to the number of the survivor paths on the backtracking states, and the backtracking state having a higher sequence has higher accuracy, and it is used to perform backtracking decoding first and facilitate to increase a decoding success rate.

In this embodiment, the training system is formed of two transport blocks connected in series, and the number of the required transport blocks is small, so that the delay is decreased. In the S31, the survivor paths of the training system may be acquired through external equipment. Of course, the survivor paths may be calculated with a calculation unit disposed in the training system. The method of calculating the survivor paths includes, but not limited to, the ML criterion.

In an example, if a transport block is the coder described in the background of the invention and includes 6 shift registers, $2^6=64$ input states or output states in total exist, so that the number of the survivor paths of the training system including the two transport blocks may be selected to be 64.

Figure 4:
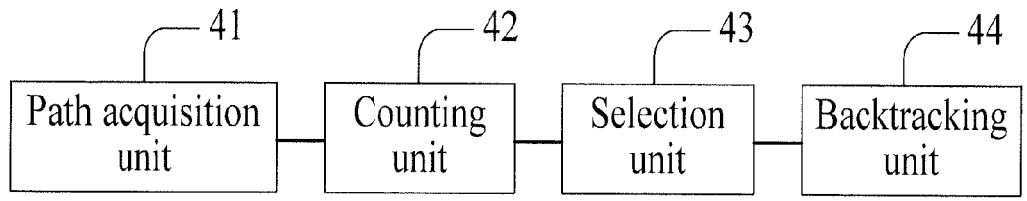
FIG. 4 is a schematic view of a tail-biting decoding device according to an embodiment of the present invention.

FIG. 4 is a schematic view of a tail-biting decoding device according to an embodiment of the present invention. Referring to FIG. 4, the device includes a path acquisition unit 41, a counting unit 42, a selection unit 43, and a backtracking unit 44.

The path acquisition unit 41 is adapted to acquire survivor paths of a training system, wherein the training system is formed of a first transport block and a second transport block, which are connected in series.

The counting unit 42 is adapted to count the number of survivor paths passing through each first state of the second transport block.

The selection unit 43 is adapted to select a first state having a maximum number of survivor paths as a backtracking state of the second transport block, or select at least two first states whose numbers of survivor paths rank at the top as backtracking states of the second transport block.

The backtracking unit 44 is adapted to perform backtracking decoding on the second transport block by using survivor paths of a selected the backtracking state, to obtain a decoding result.

The device is capable of improving the accuracy of backtracking state selection, so as to improve the accuracy of decoding. In an example, the backtracking unit 44 may include a sequence-arranging module and a sequence backtracking module. The sequence-arranging module is adapted to arrange at least two backtracking states in sequence according to the number of the survivor paths on each backtracking state when the at least two backtracking states exist. The sequence backtracking module is adapted to perform backtracking decoding on the second transport block according to the sequence by using the survivor paths on each backtracking state in turn and complete a decoding process when a decoding result is obtained. Backtracking may be first performed from a backtracking state with higher accuracy by arranging backtracking states in sequence, so that the accuracy of decoding is improved.

In another example, the backtracking unit 44 may include a first selection module, a second selection module, an initial backtracking module, and a competition backtracking module. The first selection module is adapted to select a survivor path having the maximum branch cumulative metric value on the backtracking state as an initial backtracking path. The second selection module is adapted to select a survivor path having a branch cumulative metric value next to the branch cumulative metric value of the initial backtracking path on the backtracking state as a competition path. The initial backtracking module is adapted to perform backtracking decoding on the second transport block by using the initial backtracking path. The competition backtracking module is adapted to perform backtracking decoding on the second transport block by using the competition path when the backtracking decoding performed on the second transport block by using the initial backtracking path has an incorrect result. The backtracking unit 44 first performs backtracking decoding by using the initial backtracking path. If the backtracking decoding fails, backtracking decoding is performed by using the competition path, so that for the backtracking state, the decoding success rate is improved.

The device may further include a calculation unit, adapted to calculate the survivor paths of the training system by using the ML criterion and provide the calculation result to the path acquisition unit.

Figure 1:
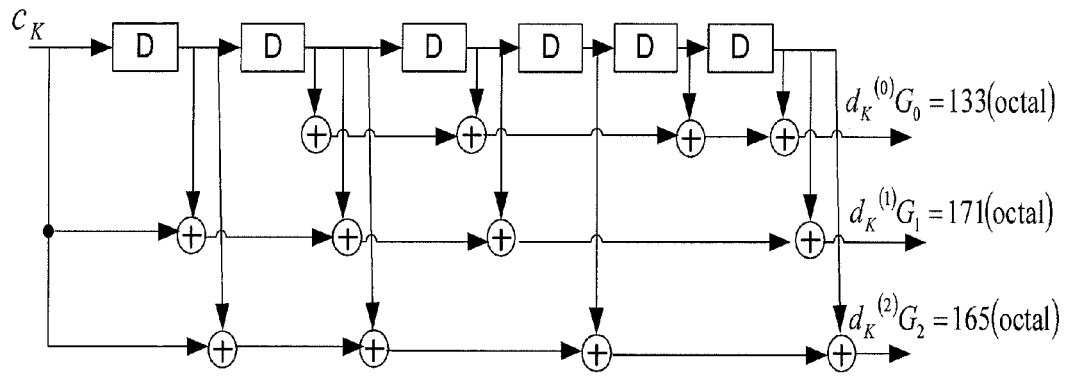
FIG. 1 is a schematic view of a tail biting convolutional code coder in the prior art.
Figure 2:
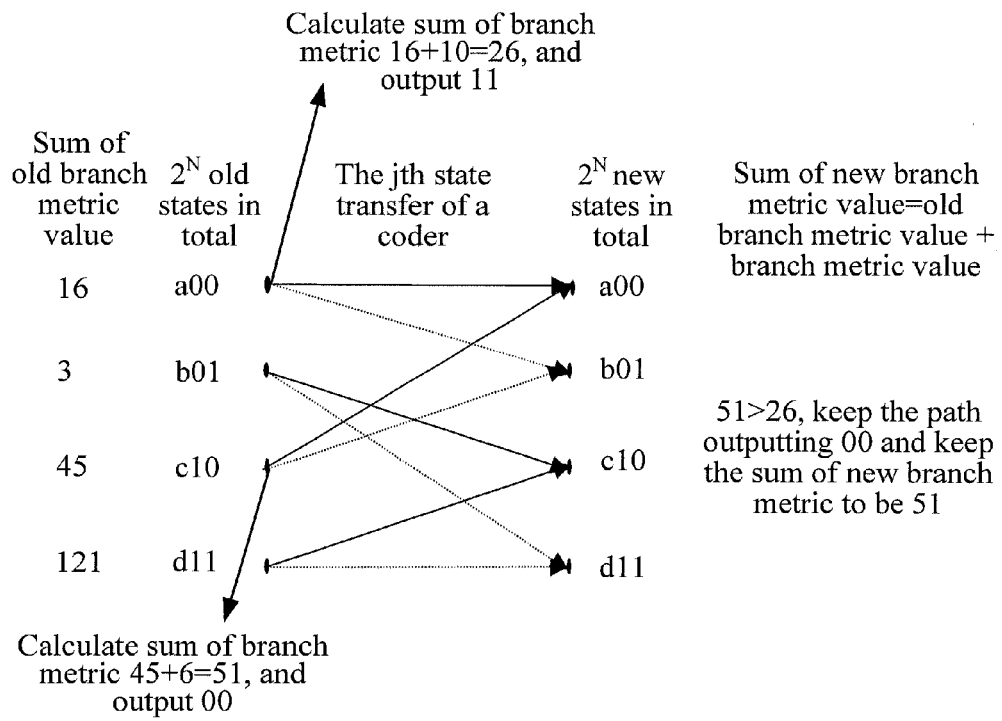
FIG. 2 is a schematic view of an add-compare-select process of a Viterbi decoding algorithm in the prior art.
Figure 5:
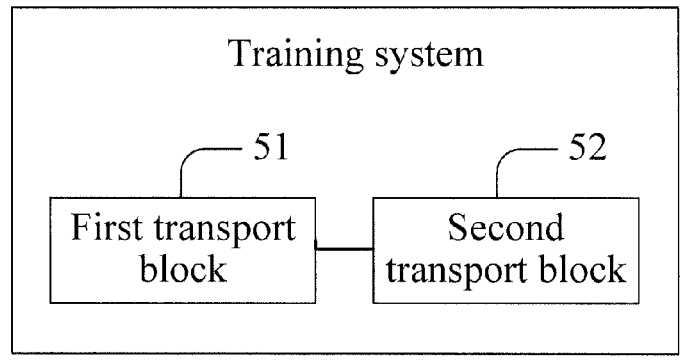
FIG. 5 is a schematic view of a training system formed of two transport blocks connected in series.

For ease of understanding, it is assumed that the first transport block and the second transport block in the training system are the same as the coder in FIG. 1 and each transport block includes 6 shift registers, so that each transport block may have 64 input states and output states. 64 survivor paths may be calculated by using the ML criterion. Next, a backtracking state is selected by using the reliability criterion for performing backtracking. As mentioned in the previous embodiments, the reliability of a state is the number of the survivor paths on the state. FIG. 5 is a schematic view of a training system formed of two transport blocks connected in series and the two transport blocks are a first transport block 51 and a second transport block 52. The training system is formed of the two transport blocks connected in series to generate the survivor paths of the training system. The second transport block 52 is further adapted to perform backtracking decoding and the first transport block 51 is merely adapted to generate the survivor paths, but not to perform backtracking decoding. The first state and the end state of the transport blocks in the tail-biting decoding method are the same, and the end state of the first transport block is the first state of the second transport block. The first state of the second transport block has 64 possibilities and each possible first state may have a survivor path passing through the first state. The number of the survivor paths on each first state of the second transport block may be counted, that is, the reliability of each first state of the second transport block is counted. Specifically, S (S is greater than or equal to 1) states having the highest reliability may be selected as a backtracking state. Optionally, storage equipment may be disposed between the two transport blocks, so as to store the first state of the second transport block. When the backtracking states are determined, as mentioned in the previous embodiments, the backtracking states are arranged in sequence according to the reliability, and backtracking decoding is performed by using the survivor paths of the backtracking states according to the sequence. According to the reliability, N backtracking states are assigned numbers of State 1, State 2, and State N, and the reliability of the states from State 1 to State N decreases. It should be understood by persons skilled in the art that, if a decoding result can be obtained through backtracking decoding by using the survivor paths of State 1, the decoding process is finished. If a decoding result cannot be obtained through backtracking decoding by using the survivor paths of State 1, backtracking decoding is performed by using the survivor path of State 2, and so on, till a decoding result is obtained. In this embodiment, as backtracking decoding is only performed on the second transport block, the decoding complexity is decreased. As the end state and the first state of the second transport block are the same and 64 possibilities exist, the possibility of obtaining the correct decoding result from different end states is different. Because S states having the highest reliability have been selected as backtracking states in advance, the backtracking states may be determined from the 64 end states of the second transport block, and backtracking decoding is performed on the second transport block from the backtracking states, so as to improve the possibility of correct decoding.

When backtracking decoding is performed, the survivor path having the maximum branch cumulative metric value on the backtracking state can be used as the initial backtracking path, and backtracking decoding is performed by using the initial backtracking path. If a decoding result cannot be obtained correctly through backtracking decoding by using the initial backtracking path, the backtracking process by using the initial backtracking path is unsuccessful. At this time, the backtracking decoding may be performed by using the alternative competition path. When multiple competition paths exist, the competition path selected in priority order for decoding may be set. The competition path having the maximum branch cumulative metric value may be selected in priority order to perform backtracking decoding, or the competition path closest to the end state may be selected in priority order to perform backtracking decoding, which is not limited in this embodiment. In this embodiment, the end state refers to the output state of the transport block and the first state refers to the input state of the transport block.

The accuracy probability of backtracking by selecting each one of multiple states is illustrated with reference to Tables 1 and 2.

TABLE 1

| (Maximum Cumulative Path Metric value)/SNR | Probability that One State Selected is the Ideal State | Probability that Two States Selected include the Ideal State | Probability that Three States Selected include the Ideal State | Probability that Four States Selected include the Ideal State |
|---|---|---|---|---|
| −6 | 99.9% | 99.9% | 99.9% | 99.9% |
| −8 | 93.0% | 93.8% | 94.3% | 94.6% |
| −10 | 52.2% | 56.2% | 58.3% | 59.7% |
| −12 | 17.3% | 20.6% | 22.7% | 23.9% |

TABLE 2

| (Possibility Criterion: Being Backtracked most times)/SNR | Probability that One State Selected is the Ideal State | Probability that Two States Selected include the Ideal State | Probability that Three States Selected include the Ideal State | Probability that Four States Selected include the Ideal State |
|---|---|---|---|---|
| −6 | 99.9% | 99.9% | 99.9% | 99.9% |
| −8 | 92.8% | 95.1% | 95.7% | 96.1% |
| −10 | 53.1% | 61.2% | 65.4% | 67.7% |
| −12 | 18.3% | 25.3% | 29.8% | 32.8% |

Table 1 shows the accuracy probability of performing state backtracking by using the maximum cumulative path metric criterion in the prior art. Table 2 shows the accuracy probability of performing state backtracking by using the highest reliability criterion according to an embodiment the present invention. It can be known from Tables 1 and 2 that when a backtracking state is determined by using the tail-biting decoding method according to the embodiment of the present invention, that is, when backtracking is performed by selecting 4 states according to the highest reliability criterion, the accuracy probability is improved significantly compared with the prior art.

Figure 6:
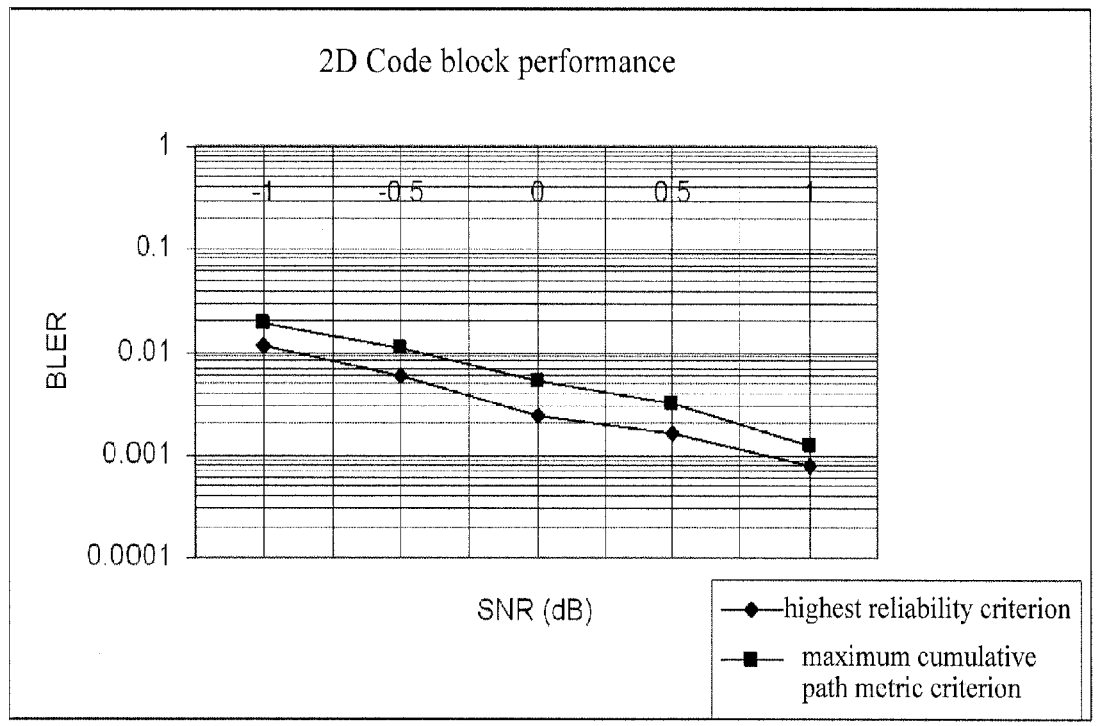
FIG. 6 is a performance comparison chart of a tail-biting decoding method according to an embodiment of the present invention and a tail-biting decoding method in the prior art.

FIG. 6 is a performance comparison chart of a tail-biting decoding method according to an embodiment of the present invention and a tail-biting decoding method in the prior art. It can be seen from FIG. 6 that, the highest reliability criterion according to the embodiment of the present invention achieves better decoding performance than the maximum cumulative path metric criterion in the prior art, and the method according to the embodiment of the present invention merely requires two transport blocks, so that the decoding delay is decreased. When the method according to the embodiment of the present invention is used together with the multi-path criterion, the accuracy of decoding may be further improved. The embodiments of the present invention are particularly applicable to Viterbi decoding algorithm of a convolutional code.

Persons of ordinary skill in the art should understand that all or a part of the steps of the method according to the embodiments of the present invention may be implemented by a program instructing relevant hardware. The program may be stored in a computer readable storage medium. When the program is run, the steps of the method according to the embodiments of the present invention are performed. The storage medium may be a magnetic disk, an optical disk, a read-only memory (ROM), or a random access memory (RAM).

The above description is merely the specific implementation methods of the present invention, but the protection scope of the present invention is not intended to be limited thereto. Variations and modifications easily made by persons skilled in the art without departing from the spirit of the present invention fall within the scope of the present invention. Therefore, the protection scope of the present invention should be defined by the appended claims.

What is claimed is:

1. A tail-biting decoding method, comprising:
    acquiring survivor paths of a training system, wherein the training system is formed of a first transport block and a second transport block, which are connected in series;
    counting the number of survivor paths passing through each first state of the second transport block;
    selecting a first state having a maximum number of survivor paths as a backtracking state of the second transport block, or selecting at least two first states whose numbers of survivor paths rank at the top as backtracking states of the second transport block; and
    performing backtracking decoding on the second transport block by using survivor paths of a selected backtracking state, to obtain a decoding result.

2. The tail-biting decoding method according to claim 1, wherein the performing backtracking decoding on the second transport block by using survivor paths of a selected backtracking state comprises:
    selecting a survivor path having a maximum branch cumulative metric value on the selected backtracking state as an initial backtracking path;
    selecting a survivor path having a branch cumulative metric value next to the branch cumulative metric value of the initial backtracking path on the selected backtracking state as a competition path;
    performing backtracking decoding on the second transport block by using the initial backtracking path; and
    when the performing backtracking decoding on the second transport block by using the initial backtracking path has an incorrect result, performing backtracking decoding on the second transport block by using the competition path.

3. The tail-biting decoding method according to claim 2, wherein the performing backtracking decoding on the second transport block by using the competition path comprises:
    if at least two competition paths exist, selecting a competition path closest to an end state from the at least two competition paths, and performing backtracking decoding on the second transport block by using the selected competition path.

4. The tail-biting decoding method according to claim 1, wherein the performing backtracking decoding on the second transport block by using survivor paths of a selected backtracking state comprises:
    when at least two backtracking states exist, arranging the at least two backtracking states in sequence according to the number of the survivor paths on each backtracking state; and
    performing backtracking decoding on the second transport block according to the sequence by using the survivor paths on each backtracking state in turn, and completing a decoding process when a decoding result is obtained.

5. The tail-biting decoding method according to claim 1, wherein the survivor paths of the training system are calculated by using a maximum likelihood (ML) criterion.

6. The tail-biting decoding method according to claim 1, wherein the number of the survivor paths of the training system is 64 in total, and both the number of input states and the number of output states of the first transport block or the second transport block are 64.

7. The tail-biting decoding method according to claim 1, wherein the method is executed by a tail-biting decoding device.

8. The tail-biting decoding method according to claim 1, wherein the method is used for decoding a tail-biting convolutional code in a long term evolution (LTE) system.

9. A tail-biting decoding device, comprising:
    a path acquisition unit, configured to acquire survivor paths of a training system, wherein the training system is formed of a first transport block and a second transport block, which are connected in series;
    a counting unit, configured to count the number of survivor paths passing through each first state of the second transport block;
    a selection unit, configured to select a first state having a maximum number of survivor paths as a backtracking state of the second transport block, or select at least two first states whose numbers of survivor paths rank at the top as backtracking states of the second transport block; and
    a backtracking unit, configured to perform backtracking decoding on the second transport block by using survivor paths of a selected the backtracking state, to obtain a decoding result.

10. The tail-biting decoding device according to claim 9, wherein the backtracking unit comprises:
    a sequence-arranging module, configured to arrange at least two backtracking states in sequence according to the number of the survivor paths on each backtracking state; and
    a sequence backtracking module, configured to perform backtracking decoding on the second transport block according to the sequence by using the survivor paths on each backtracking state in turn, and complete a decoding process when a decoding result is obtained.

11. The tail-biting decoding device, according to claim 9, wherein the backtracking unit comprises:
    a first selection module, configured to select a survivor path having a maximum branch cumulative metric value on a selected backtracking state as an initial backtracking path;

a second selection module, configured to select a survivor path having a branch cumulative metric value next to the branch cumulative metric value of the initial backtracking path on the selected backtracking state as a competition path;

an initial backtracking module, configured to perform backtracking decoding on the second transport block by using the initial backtracking path; and a competition backtracking module, configured to perform backtracking decoding on the second transport block by using the competition path, when the performing backtracking decoding on the second transport block by using the initial backtracking path has an incorrect result.

12. The tail-biting decoding device according to claim 9, further comprising:

a calculation unit, configured to calculate the survivor paths of the training system by using a maximum likelihood (ML) criterion, and provide a calculation result to the path acquisition unit.

13. A computer-readable storage medium, comprising computer program codes which when executed by a computer processor cause the compute processor to execute process of:

acquiring survivor paths of a training system, wherein the training system is formed of a first transport block and a second transport block, which are connected in series;

counting the number of survivor paths passing through each first state of the second transport block;

selecting a first state having a maximum number of survivor paths as a backtracking state of the second transport block, or selecting at least two first states whose numbers of survivor paths rank at the top as backtracking states of the second transport block; and performing backtracking decoding on the second transport block by using survivor paths of a selected backtracking state, to obtain a decoding result.

14. The computer-readable storage medium according to claim 13, wherein the performing backtracking decoding on the second transport block by using survivor paths of a selected backtracking state comprises:

selecting a survivor path having a maximum branch cumulative metric value on the selected backtracking state as an initial backtracking path;

selecting a survivor path having a branch cumulative metric value next to the branch cumulative metric value of the initial backtracking path on the selected backtracking state as a competition path;

performing backtracking decoding on the second transport block by using the initial backtracking path; and when the performing backtracking decoding on the second transport block by using the initial backtracking path has an incorrect result, performing backtracking decoding on the second transport block by using the competition path.

* * * * *